United States Patent [19]

Leonov

[11] Patent Number: 4,790,661

[45] Date of Patent: Dec. 13, 1988

[54] CROSS-MASK HOLDER DEVICE

[75] Inventor: Mark Leonov, Santa Clara, Calif.

[73] Assignee: Intel Corporation, Santa Clara, Calif.

[21] Appl. No.: 98,523

[22] Filed: Sep. 18, 1987

[51] Int. Cl.$^4$ .............................................. G01B 11/00
[52] U.S. Cl. ..................................... 356/401; 350/566
[58] Field of Search ............... 356/401; 350/565, 566; 355/43, 53

[56] References Cited

U.S. PATENT DOCUMENTS

| | | | |
|---|---|---|---|
| 3,927,480 | 12/1975 | Robertsson | 356/5 |
| 4,414,749 | 11/1983 | Johannsmeier | 350/566 |
| 4,452,526 | 6/1984 | Johannsmeier et al. | 355/43 |

Primary Examiner—F. L. Evans
Attorney, Agent, or Firm—Blakely, Sokoloff, Taylor & Zafman

[57] ABSTRACT

A cross-mask and cross-mask holder with improved adjustment means. A cross-mask holder allows adjustment of a cross-mask in the x, y and theta directions. The cross-mask may be adjusted in the x and the y directions through use of screws on the side of the holder and may be adjusted in the theta direction by turning a tube which contains the cross-mask. The invention further discloses the use of an umbrella and cover assembly to reduce light source background noise which improves the alignment signal on an oscilloscope during processing of semiconductor wafers in a stepper machine.

17 Claims, 2 Drawing Sheets

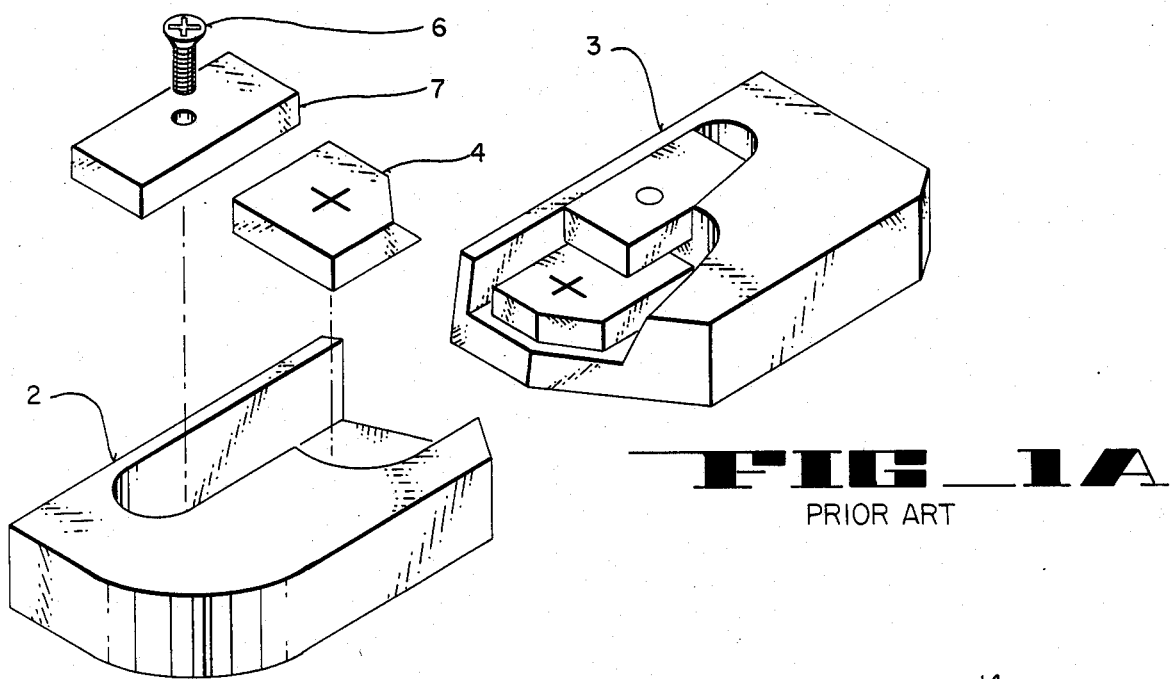
FIG_1A PRIOR ART
FIG_1B PRIOR ART
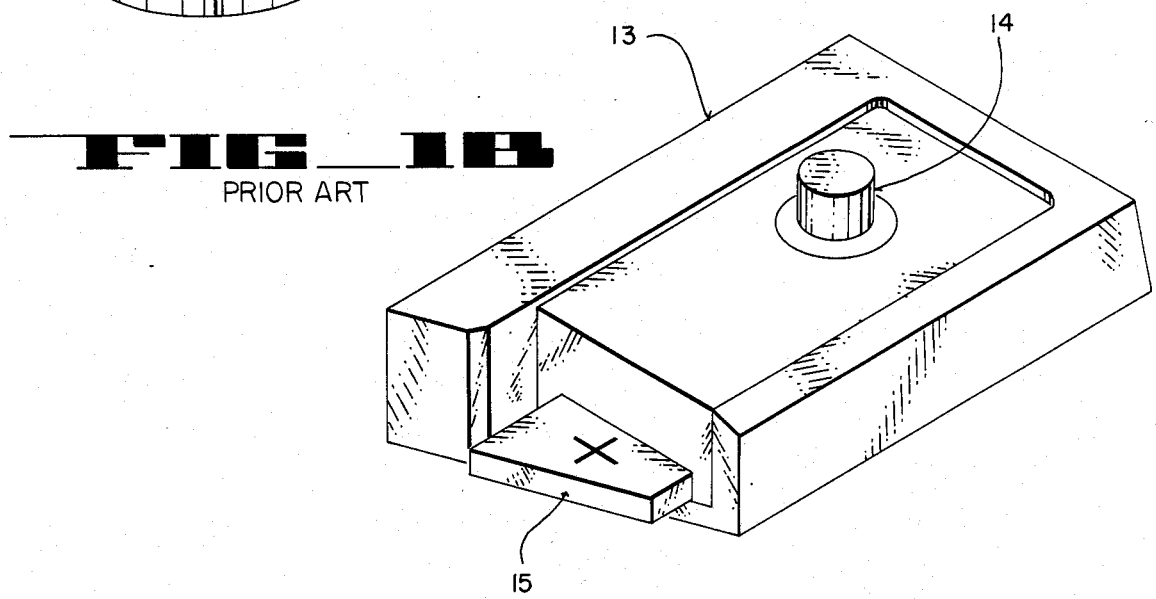
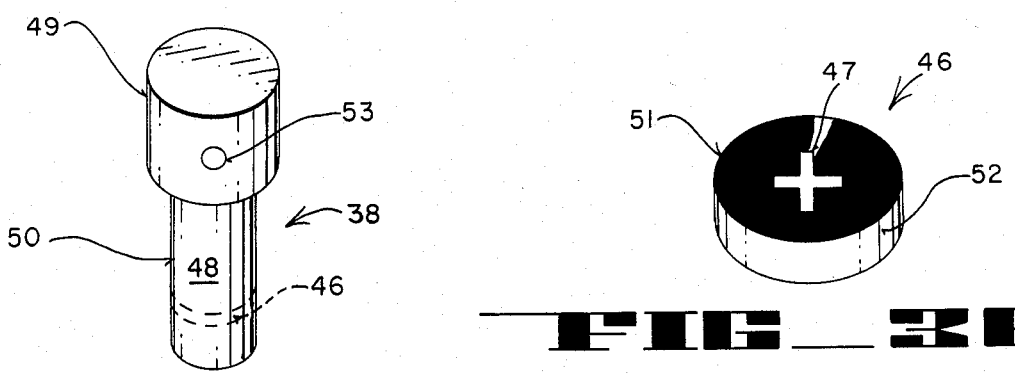
FIG_3A
FIG_3B

FIG_2
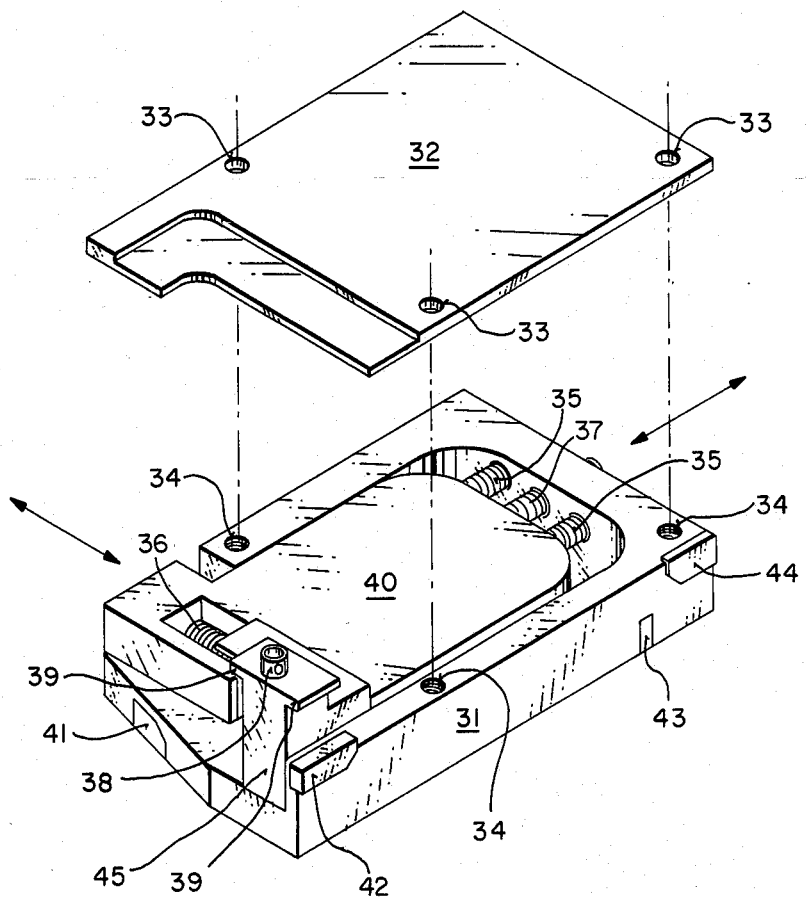
FIG_4
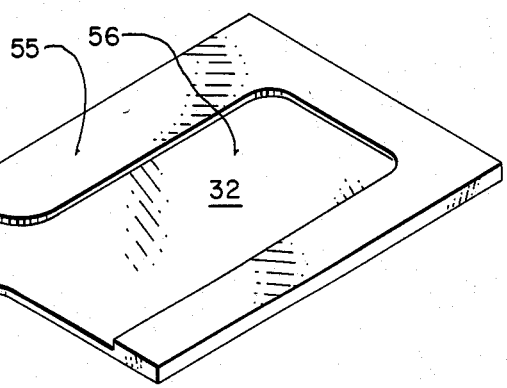
FIG_5
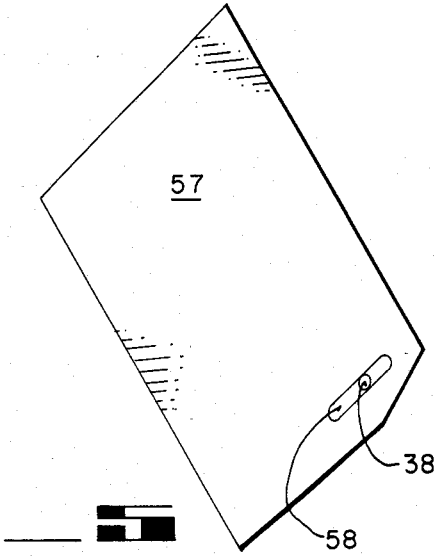

CROSS-MASK HOLDER DEVICE

BACKGROUND OF THE INVENTION

1. Field of the Invention

The invention relates to the field of wafer fabrication photolithography equipment and, more specifically, to cross-masks for stepper machines.

2. Prior Art

In the field of stepper machines for semiconductor wafer fabrication it is necessary to have cross-masks or some other method for aligning wafers in the stepper machines. By examining wafer alignment through a cross-mask device, wafers may be aligned in a stepper machine for subsequent processing. Proper alignment of the wafers in stepper machines is extremely important and becomes increasingly important as die size decreases and processing parameters are tightened.

One known cross-mask and holder device comprises a holder with screws for adjusting a separate cross-mask plate. This device suffers from requiring an extemely long set-up time for adjusting the cross-mask, due to movement of the cross-mask plate while tightening the screws. In addition, adjustment of the cross-mask is only possible in the x and the y direction and not in a Theta direction. This prior art cross-mask and holder device will be described in more detail in conjunction with FIG. 1(a).

Another known device comprises a cross-mask holder with the cross-mask permanently attached to the holder. This method allows movement of the cross-mask in only one direction, although it does offer an advantage of protecting the cross-mask from damage. In addition, this method utilizes an adjustment device which reduces the amount of time required for adjusting the cross-mask. However, the accuracy of the adjustment is less than that desired. This cross-mask will be more fully described in conjunction with FIG. 1(b).

SUMMARY OF THE INVENTION

A cross-mask and holder device is disclosed which reduces the amount of time required for adjusting the cross-mask to align wafers in a stepper machine and increases the accuracy of alignment. The present invention discloses a cross-mask which is adjustable in the x and the y direction through the use of screw and spring assemblies. This allows for relatively easy and accurate alignment of the cross-masks.

In the preferred embodiment, the cross-mask is mounted in a theta tube which serves several functions. First, the theta tube may be rotated for further adjustment and alignment of the cross-mask. Second, the theta tube protects the cross-mask from scratches, chips and breakage.

In addition, the device is protected with an umbrella style cover which eliminates background noise and greatly improves alignment signals produced when viewing through the cross-mask.

BRIEF DESCRIPTION OF THE DRAWINGS

FIG. 1(a) illustrates a prior art cross-mask and holder device comprising a cross-mask, a tab and a cross-mask holder.

FIG. 1(b) illustrates a prior art cross-mask and holder device comprising a cross-mask holder, cross-mask and adjustment device.

FIG. 2 illustrates a cross-mask holder device as may be utilized by the present invention.

FIG. 3(a) illustrates a theta tube as may be utilized by the present invention.

FIG. 3(b) illustrates a cross-mask as may be utilized by the present invention.

FIG. 4 is a bottom-side view of a cover as may be utilized by the present invention.

FIG. 5 is a bottom-side view of a cross-mask holder as may be utilized by the present invention.

DETAILED DESCRIPTION OF THE PRESENT INVENTION

A cross-mask and holder apparatus is described which is particularly suitable for a stepper machine used in fabrication of semiconductor wafers. In the following description, numerous specific details are set forth in order to provide a thorough understanding of the present invention. It will be obvious, however, to one skilled in the art that the present invention may be practiced without these specific details. In other instances, well known structures, materials, etc., are not set forth in detail in order to not unnecessarily obscure the present invention.

DESCRIPTION OF PRIOR ART

During fabrication of semiconductor wafers it is necessary to use a stepper machine such as that supplied by Ultrateach Stepper of Santa Clara, Calif. Wafers may be inserted into the stepper machine and various layers may be applied to the wafer or other processing steps may occur. During these processing steps alignment of the wafer in the stepper machine is critical. Therefore, wafers may be marked with a cross-mask for alignment purposes. The stepper machine comprises a cross-mask and holder device for allowing alignment with the wafer. By adjusting the position of the cross-mask and the cross-mask holder device to align it with a cross-mask on the wafer, proper alignment of the wafer in the stepper machine is accomplished.

Typically, the alignment process comprises the steps of first applying a light source to the cross-mask, the light source shining through the cross-mask and onto the wafer through a plurality of mirrors and lenses. The light may then be reflected back through the mirrors and through the cross-mask. Often, the light source that is reflected back is coupled with an oscilloscope or similar device. The light is only reflected back from the cross-masks and is otherwise absorbed by the wafer. Therefore, the oscilloscope will show a peak when the cross-mask is properly aligned. Due to ambient light reflecting at various angles off the cross-mask there is typically a great deal of background noise on the oscilloscope.

Referring now to FIG. 1(a), a left cross-mask holder 2 and a right cross-mask holder 3 of known construction are described. The cross-mask holders 2 and 3 are coupled a cross-mask 4 through use of a screw 6 and clamp 7. The cross-masks position may be adjusted by loosening screw 6 and moving the cross-mask 4 and retightening the screw 6. Typically, this requires numerous iterations to properly adjust the cross-mask for alignment with a wafer in the stepper machine.

Referring now to FIG. 1(b), another known cross-mask 15 and holder device 13 are described. The cross-mask holder 13 is coupled with a screw 14 and a cross-mask 15. The cross-mask may be adjusted by loosening the screw 14 and manually adjusting the cross-mask.

However, the cross-mask may only be adjusted in a single direction.

DESCRIPTION OF THE PRESENT INVENTION

The present invention discloses a cross-mask holder and device which is capable of adjusting a cross-mask in the x, y and theta directions. Adjustment may be done with a minimum amount of time and with increased accuracy and improved process quality. The present invention also discloses apparatus for minimizing background noise to improve the alignment signal on an oscilloscope.

Referring now to FIG. 2, the present invention comprises a cross-mask holder device having a cover 32 and a body 31. The body 31, has two screws 36 and 37 for adjustment in the x and the y directions. For increased accuracy in the adjustment, springs 35 are provided. The cross-mask of the present invention is contained in a theta tube 38. The theta tube 38 is moved in the x and the y directions by adjusting the screws 36 and 37. After the theta tube 38 is adjusted with the screws 36 and 37 to a position above the cross-mark on the wafer, the cross-mask in the theta tube 38 may be aligned by turning the theta tube 38.

An umbrella cover 39 is utilized in the preferred embodiment. The umbrella cover 39 is designed to minimize background noise to improve an alignment signal on an oscilloscope, as mentioned previously. In the preferred embodiment, a light source is utilized to shine up from the stepper machine and through the cross-mask tube 38. This light source is optically coupled with the oscilloscope to provide the alignment signal.

Referring briefly to FIG. 5, the bottom side 57 of the cross-mask holder is shown including an oval opening 58. The oval opening 58 allows movement of the cross-mask tube 38 in the x direction. The alignment light source may shine through this oval opening 58 as well as through the cross-mask tube 38. Light shining through the oval opening 58 may cause background noise on the oscilloscope. It is this light which the umbrella 39, referred to in FIG. 2, is designed to block.

Referring again to FIG. 2, the cover 32 is provided for protection of the apparatus and to prevent particulates and other debris from entering the apparatus. The cover 32 further protects from light source reflection. The cover 32 is fastened to the holder 31 by screws which are placed through screw holes 33 and coupled with screw holes 34. The holder is coupled with the stepper machine through use of magnets, 41, 42, 43 and 44.

Referring now to FIG. 3(a), the theta tube 38 is shown. Theta tube 38 comprises a tube 48 and a cross-mask 46. The cross-mask 46 is located at the bottom of the tube 48. The top 49 of the tube 48 is slightly larger then the bottom 50 to prevent the tube 48 from slipping into the cross-mask tube holder.

Referring now to FIG. 3(b), the cross-mask 46 is again shown. The cross-mask 46 is comprised of a cylindrical piece of glass 52 with chrome coating 51 forming a mirror. In the center of the chrome coating 51 a cross-mask 47 is cut out. To allow for proper theta alignment, the cross-mask 47 must be centered on the glass 52.

In the preferred embodiment the chrome coating 51 is approximately 3000 Angstroms thick. It has been found that chrome coatings of lesser thickness are not as effective at preventing the penetration of light.

Referring to FIG. 4, the underside of the cover 32 is shown. The underside of the cover 32 comprises a thicker area 55 and a thinner area 56. The thicker area 55 rests on the body 31 when the cover is in place. The thinner area 56 rests against the cross-mask tube holder 45 and against the slider 40. This design allows the cover 40 to provide a degree of friction on the slider 40 and the cross-mask tube holder 45 which tends to stabilize the slider 40 and cross-mask tube holder 45 during adjustment in the X and Y directions.

Thus, an improved cross-mask and holder device for use in a stepper machine during processing of semiconductor wafers is described. The cross-mask and holder device allows for faster and more accurate alignment of wafers in the stepper machine.

I claim:

1. An apparatus for aligning a cross-mask, comprising:
    a holder;
    a cross-mask apparatus coupled with said holder;
    a first adjustment means coupled with said holder for adjusting said cross-mask in a first linear direction;
    a second adjustment means coupled with said holder for adjusting said cross-mask in a second linear direction generally perpendicular to said first linear direction;
    said cross-mask moving in said first linear direction when said first adjustment means is adjusted and said cross-mask moving in said second linear direction when said second adjustment means is adjusted;
    whereby, said cross-mask may be aligned through use of said first and said second adjustment means.

2. The apparatus, as recited by claim 1, wherein said cross-mask apparatus comprises a cross-mask and a tube for holding said cross-mask.

3. The apparatus, as recited in claim 2, wherein said tube may be moved in a third direction within said holder for adjustment of said cross-mask in said third direction.

4. The apparatus, as recited in claim 3, wherein said holder comprises an umbrella for reducing light background noise.

5. The apparatus, as recited in claim 1, wherein said first adjustment means comprises a screw.

6. The apparatus, as recited in claim 5, wherein said first adjustment means further comprises at least one spring.

7. The apparatus, as recited in claim 1, wherein said second adjustment means comprises a screw.

8. The apparatus, as recited in claim 1, wherein said apparatus further comprises a cover which may be coupled with said holder for protecting said apparatus and for further reducing light background noise.

9. The apparatus, as recited in claim 1, wherein said holder further comprises at least one magnet for coupling said holder with a machine.

10. In a cross-mask and holder apparatus for aligning a cross-mask with a mark on a semiconductor wafer, said apparatus having a cross-mask apparatus and a holder apparatus, an improvement comprising;
    a first adjustment means coupled with said holder for adjusting said cross-mask in a first direction;
    a second adjustment means coupled with said holder for adjusting said cross-mask in a second direction generally perpendicular with said first direction;
    said cross-mask moving in said first direction when said first adjustment means as adjusted;
    said cross-mask moving in said second direction when said second adjustment means as adjusted;

a tube for holding said cross-mask;
said tube capable of moving said cross-mask in a third direction;
wherein improved adjustment of said cross-mask is achieved.

11. The improvement, as recited in claim 10, wherein said holder comprises an umbrella for reducing light source background noise.

12. An improvement, as recited in claim 10, wherein said first adjustment means comprises a screw.

13. An improvement, as recited in claim 12, wherein said first adjustment means further comprises at least one spring.

14. An improvement, as recited in claim 10, wherein said second adjustment means comprises a screw.

15. An improvement, as recited in claim 10, wherein said apparatus further comprises a cover which may be coupled with said holder for protecting said apparatus and for further reducing light background noise.

16. An improvement, as recited in claim 15, wherein said holder further comprises magnets for coupling said holder with a machine.

17. In a cross-mask and holder apparatus for aligning a cross-mask with a mark on a semiconductor wafer during processing of the wafer in a stepper machine, an improvement comprising;
a holder having a first and second adjustment means;
a cross-mask apparatus comprising a tube having a cross-mask within it, said tube for protecting said cross-mask and for allowing adjustment of said cross-mask in a first direction;
said first adjustment means comprising a screw and at least one spring for adjusting said cross-mask in a second direction;
said second adjustment means having a screw for adjusting said cross-mask in a third direction generally perpendicular with said second direction;
said apparatus further comprising a cover for protecting said apparatus and for reducing light background noise;
said holder further comprising an umbrella for further reducing light background noise;
whereby, improved adjustment of said cross-mask is achieved.

* * * * *